United States Patent
Maeda et al.

(10) Patent No.: US 6,346,568 B1
(45) Date of Patent: Feb. 12, 2002

(54) LIQUID CRYSTAL POLYESTER RESIN COMPOSITION AND MOLDED ARTICLE THEREOF

(75) Inventors: Mituo Maeda, Tsukuba; Hiroshi Nakamura, Tsuchiura, both of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/568,032

(22) Filed: May 10, 2000

(30) Foreign Application Priority Data

May 13, 1999 (JP) ............................. 11-132573

(51) Int. Cl.$^7$ ............................ C08K 3/00; C08K 9/00
(52) U.S. Cl. ............................... 524/495; 523/217
(58) Field of Search ................... 523/217; 428/378, 428/382, 383, 390; 524/495

(56) References Cited

U.S. PATENT DOCUMENTS

| | | | |
|---|---|---|---|
| 3,837,892 A | * 9/1974 | Marzocchi | ................ 428/388 |
| 3,922,466 A | * 11/1975 | Bell et al. | ................ 428/388 |
| 4,161,470 A | 7/1979 | Calundann | |
| 4,803,235 A | 2/1989 | Okada | |
| 5,371,123 A | * 12/1994 | Gallucci et al. | ............ 524/494 |
| 5,646,209 A | * 7/1997 | Furuta et al. | ................ 524/494 |
| 5,830,940 A | * 11/1998 | Nakamura et al. | ........... 524/415 |
| 6,075,114 A | * 6/2000 | Uemetsu et al. | ............. 528/272 |
| 6,121,369 A | * 9/2000 | Stack et al. | .................. 524/495 |
| 6,121,388 A | * 9/2000 | Umetsu et al. | .............. 525/425 |

FOREIGN PATENT DOCUMENTS

| | | |
|---|---|---|
| EP | 0779338 A2 | 6/1997 |
| EP | 0856536 A2 | 8/1998 |
| JP | 4747870 | 12/1972 |
| JP | 633888 | 1/1988 |
| JP | 127103 | 5/1989 |
| JP | 6240114 | 8/1994 |
| WO | WO 9855547 | 12/1998 |

* cited by examiner

Primary Examiner—Veronica P. Hoke
(74) Attorney, Agent, or Firm—Birch, Stewart, Kolasch & Birch, LLP

(57) ABSTRACT

Provided is a liquid crystal polyester resin composition prepared by compounding glass fiber with a liquid crystal polyester resin, wherein said glass fiber has been surface-treated with a thermosetting resin and the ignition loss of the surface-treated glass fiber is from 0.05 to 0.4% by weight. The molded article obtained by using the composition of the present invention have excellent mechanical property and heat-resistance, particularly, solder heat-resistance, and are extremely useful as materials for which heat-resistance is required such as electric and electronic parts.

6 Claims, No Drawings

LIQUID CRYSTAL POLYESTER RESIN COMPOSITION AND MOLDED ARTICLE THEREOF

BACKGROUND OF THE INVENTION

1. Field of the Invention

The present invention relates to a liquid crystal polyester resin composition. More specifically, the present invention relates to a liquid crystal polyester resin composition which is prepared by compounding glass fiber which has been surface-treated with a thermosetting resin.

2. Description of the Related Art

A liquid crystal polyester resin (hereinafter, referred to as liquid crystal polyester) which manifests liquid crystal property in melting is excellent in heat-resistance, and is excellent in flowability, namely processability in melting, therefore, the liquid crystal polyester is used, as a molding material which can provide precise molding, in various fields typically including electric and electronic fields. Particularly, a resin composition obtained by filling a fibrous reinforcing material such as glass fiber or the like which has been surface-treated with a thermosetting resin, into a liquid crystal polyester resin is a material suitable for electric and electronic parts having thin parts or complicated forms.

However, since this resin composition has a high processing temperature, there may sometimes occur deterioration and decomposition of the resin composition due to heat, further, generation of a decomposed gas, for example, in a melt-extrusion for obtaining a resin composition in the form of pellets to be subjected to injection molding, or in a injection-molding process of a resin composition. Since a part of deteriorated materials such as gasses and the like in processing is embedded in a molded article, when the molded article is used as parts, various problems, for example, blister due to generation of a gas in a solder process, may occur.

SUMMARY OF THE INVENTION

The object of the present invention is to solve the above-described problems and provide a glass fiber-compounded liquid crystal polyester resin composition having excellent mechanical-property and heat-resistance, particularly, solder heat-resistance.

That is, the present invention is a liquid crystal polyester resin composition comprising a liquid crystal polyester resin and surface-treated glass fiber with a thermosetting resin, wherein the ignition loss of the surface-treated glass fiber is from 0.05 to 0.4% by weight, and a molded article obtained by using the same.

The liquid crystal polyester resin composition of the present invention can be prepared by compounding glass fiber which has been surface-treated with a thermosetting resin, and has the ignition loss of from 0.05 to 0.4% by weight, into a liquid crystal polyester resin.

DETAILED DESCRIPTION OF THE INVENTION

As the liquid crystal polyester resin to be used in the present invention, exemplified are:

(1) Polyesters composed of a combination of an aromatic dicarboxylic acid, aromatic diol and aromatic hydroxycarboxylic acid, (2) Polyesters composed of different aromatic hydroxycarboxylic acid, (3) Polyesters composed of a combination of an aromatic dicarboxylic acid and aromatic diol, (4) Polyesters obtained by reacting a polyester such as polyethylene terephthalate and the like with an aromatic hydroxycarboxylic acid, and the like, and preferables are those forming isotropic melt at a temperature of not more than 400° C. from the standpoint of molding processing. Further, instead of the above-described aromatic dicarboxylic acid, aromatic diol and aromatic hydroxycarboxylic acid, ester-forming derivatives thereof may also be used.

As the repeating structure unit of the liquid crystal polyester include, the following structure units may be exemplified.

Repeating structure units derived from aromatic hydroxycarboxylic acids:

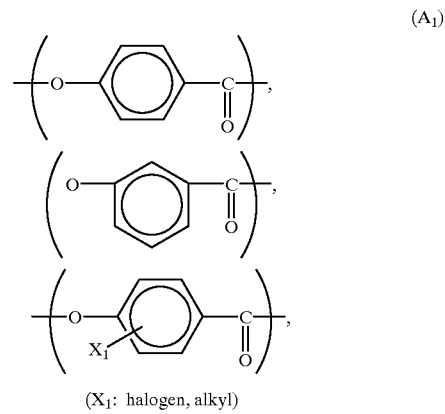

($X_1$: halogen, alkyl)

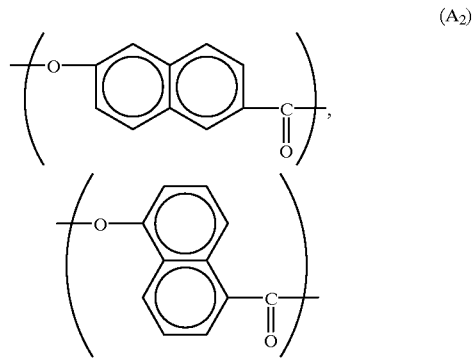

Repeating structure units derived from aromatic dicarboxylic acids:

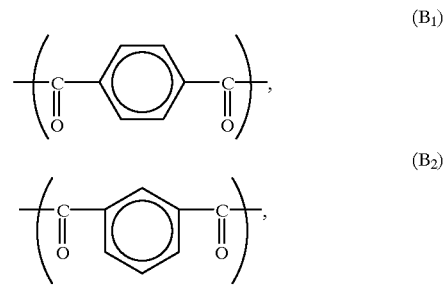

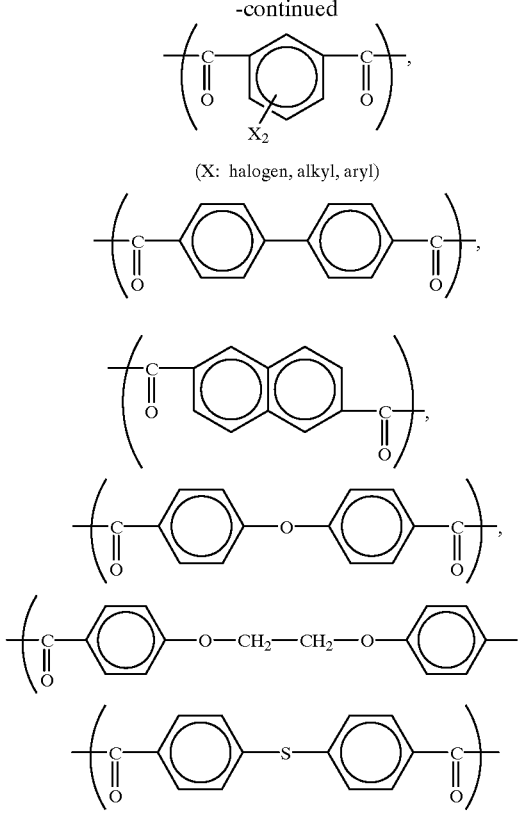

(B₃)

Repeating structure units derived from aromatic diols:

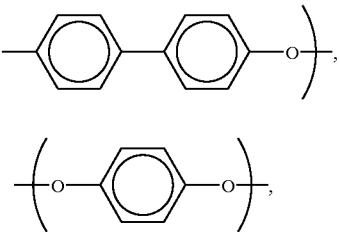

(C₁)

(C₂)

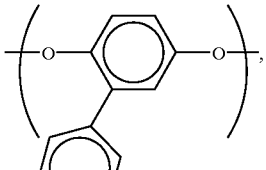

(C₃)

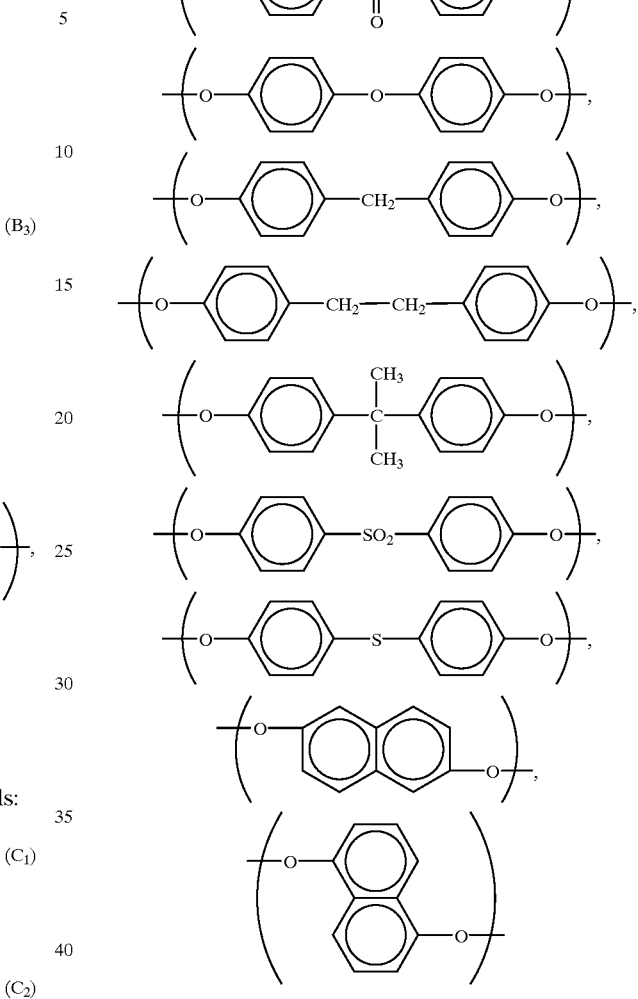

In the definition of the above substituents X1 to X3, "H" is a hydrogen atom, "alkyl" is preferably an alkyl group having 1 to 10 carbon atoms, and "aryl" is preferably an aryl group having 6 to 20 carbon atoms.

The liquid crystal polyester which is particularly preferable from the standpoint of balance between heat-resistance, mechanical property and processability is a liquid crystal polyester resin containing a repeating structure unit represented by (A₁) in an amount of at least 30 mol %. Specifically, those having repeating structure units as shown in the following (a) to (f) are preferable.

(a): combination of (A₁), (B₁) or a mixture of (B₁) and (B₂), (C₁)

(b): combination of (A₁), (A₂)

(c): combination (a) wherein a part of (A₁) is substituted by (A₂)

(d): combination (a) wherein a part of (B₁) is substituted by (B₃)

(e): combination (a) wherein a part of (C₁) is substituted by (C₃)

(f): combination (b) wherein the structure units of (B₁) and (C₂) are added

Known methods can be adopted for preparing liquid crystal polyester resins used in the present invention. For example, liquid crystal polyester resins of (a) and (b) are described in Japanese Patent Kokoku Publication (JP-B) Nos. 47-47870, 63-3888, and the like.

The glass fiber used for the present invention is generally fiber which is obtained by processing glass mainly composed of a silicate salt into fibrous form. Examples of the glass include alkaline glass for general purpose (A glass), acid-resistant glass for chemical use (C glass), low density glass (D glass), borosilicate glass (E glass) and the like, and E glass is preferable from the stand point of the strength of a molded article obtained by using the resulted resin composition, and the like. For producing glass fiber, there is generally used a method in which glass in melted state (1300° C. or more) is spun. The glass fiber may also be treated with a silane-based coupling agent, titanium-based coupling agent or the like, if necessary.

The surface treatment of glass fiber with a thermosetting resin means coating treatment of a part or all of the surface of glass fiber with an un-cured or cured thermosetting resin, as well as sizing treatment of glass fiber. This surface treatment contributes to handling property of glass fiber, affinity with a liquid crystal polyester resin, and the like.

For the surface treatment of glass fiber with a thermosetting resin, there is usually a procedure in which a thermosetting resin is made into an emulsion with an anionic, cationic or nonionic surfactant, glass fiber which has been melt-spun is immersed into the emulsion, and moisture is removed by drying. If necessary, the thermosetting resin may sometimes be cured by heating. Further, it is also useful to previously introduced the above-described coupling agent into the thermosetting resin.

As the thermosetting resin, epoxy resins, urethane resins and epoxyurethane resins are preferable from the standpoints of heat-resistance, handling property and the like, and particularly, urethane resins, or epoxyurethane resins are preferable. Further, combinations of two or more thermosetting resins, such as a combination of an epoxy resin and an urethane resin, may also be adopted. As the un-cured urethane resin, an isocyanate can be used singly or a mixed solution of an isocyanate and a polyol can be used. If necessary, a catalyst such as an amine and the like may also be contained. Further, a part of the un-cured urethane resin may also be cured. Examples of the isocyanate include tolylene dIisocyanate (TDI), diphenylmethane diisocyanate (MDI), naphthalene diisocyanate (NDI) and the like, and examples of the polyol include various polyether polyols, polyester polyols and the like. The epoxyurethane resin used in the present invention includes: a resin obtained by combining an epoxy resin having a hydroxy group with an isocyanate compound; and a resin obtained by ring-opening a part of epoxy groups in an epoxy resin using an amine or alcohol to obtain an epoxy resin having a hydroxyl group, then, combining this with an isocyanate compound, without being limited thereto.

In the present invention, the ignition loss of the glass fiber which has been surface-treated with a thermosetting resin is from 0.05 to 0.4% by weight (based on the total amount of glass fiber and the surface-treated thermosetting resin thereon), preferably from 0.1 to 0.3% by weight. The ignition loss is a value of dividing the weight loss in heating glass fiber at 625° C. for 10 minutes or longer until the weight becomes constant by the weight of the surface-treated glass fiber before heating, and can be measured according to JIS R3420. When the ignition loss is less than 0.05% by weight, the surface treatment of glass fiber may become insufficient, and handling thereof and compounding into a liquid crystal polyester resin become difficult, sometimes. On the other hand, when the ignition loss is more than 0.4% by weight, generation of a decomposed gas due to deterioration and decomposition occurs by heating, and heat stability of the resin composition, and the like are affected, undesirably. In the present invention, the ignition loss of surface-treated glass fiber corresponds approximately to the amount of the thermosetting resin adhered on the surface of the glass fiber. When the above-mentioned coupling agent is used, the ignition loss corresponds to the total of the thermosetting resin and the coupling agent.

The number-average fiber diameter of glass fiber used in the present invention is preferably from 1 to 20 $\mu$m and further preferably from 5 to 15 $\mu$m. When the number-average fiber diameter is less than 1 $\mu$m, surface treatment of glass fiber may become insufficient, and handling and compounding into a liquid crystal polyester resin becomes difficult, sometimes. On the other hand, when the number-average fiber diameter is over 20 $\mu$m, take-up property of a strand becomes unstable in melt-granulating a resin composition, undesirably.

The number-average fiber length of the glass fiber is preferably from 25 to 6000 $\mu$m, and further preferably from 30 to 3000 $\mu$m. When the number-average fiber length is shorter than 25 $\mu$m, reinforcing effect by glass fiber decreases, sometimes. When the number-average fiber length is longer than 6000 $\mu$m, take-up property of a strand in melt-granulating of a composition becomes unstable sometimes, and further, the surface condition of a product molded from the resulted resin composition may deteriorate, undesirably.

In the resin composition of the present invention, the compounding amount of glass fiber which has been surface-treated with a thermosetting resin is preferably from 10 to 200 parts by weight, more preferably from 15 to 100 parts by weight based on 100 parts by weight of the liquid crystal polyester resin. When the compounding amount is over 200 parts by weight, feeding property to screw during pelletization may deteriorate sometimes, and plasticization in molding processing becomes unstable, further, the mechanical strength of a molded article decreases and appearance thereof deteriorates, sometimes. On the other hand, when the compounding amount is less than 10 parts by weight, the mechanical strength of a molded article becomes insufficient sometimes.

For compounding raw materials to obtain the resin composition of the present invention, usually, a liquid crystal polyester resin, glass fiber which has been surface-treated with a thermosetting resin, and according to tequirement, an inorganic filler, releasing agent, heat stabilizer and the like are mixed by using a Henschel mixer, tumbler or the like, then, the mixture is melt-kneaded using an extruder. For melt-kneading, all raw materials may be mixed in one time before being fed to an extruder, or if necessary, raw materials like reinforcing materials such as glass fiber, and inorganic fillers, and the like may be fed, separately from raw materials mainly composed of a resin. In the present invention, a small amount of other fillers may be previously added if necessary, in addition to glass fiber, to a liquid crystal polyester resin. Examples of the filler include: fibrous or needle like reinforcing materials such as silica alumina fiber, wollastonite, carbon fiber, potassium titanate whisker, aluminum borate whisker, titanium oxide whisker and the like; inorganic fillers such as calcium carbonate, dolomite, talc, mica, clay, glass bead and the like, as well as other materials, and one or more of them can be used.

One or more of usual additives such as coloring agents such as dye, pigment and the like; antioxidants; heat stabilizers; ultraviolet absorbers; antistatic agents; surfactants and the like can be added to a liquid crystal polyester resin used in the present invention.

Further, in the present invention, in addition to the liquid crystal polyester resin, a small amount of other thermoplastic resins, for example, polyamide, polyester, polyphenylene sulfide, polyether ketone, polycarbonate, polyphenylene ether and modified substances thereof, polysulfone, polyether sulfone, polyether imide and the like, or a small amount of thermosetting resin, for example, phenol resins, epoxy resins, polyimide resins and the like can be added.

The molded article of the present invention is prepared by using the liquid crystal polyester resin composition of the present invention, and obtained by molding the liquid crystal polyester resin composition by a known method. As the molding method, an injection molding method, compression molding method, extrusion molding method, hollow molding method and the like are listed, and the injection molding method is preferable. Use of parts and members molded from the resin composition of the present invention includes: electric and electronic parts such as connector, socket, relay parts, coil bobbin, light pick up vibrator, printed wiring board, computer-related parts and the like; semiconductor production process-related parts such as IC tray, wafer carrier and the like; domestic electric appliance parts such as VTR, television, iron, air conditioner, stereo, cleaner, refrigerator, rice cooker, illumination instruments and the like; illumination instrument parts such as lamp reflector, lamp holder and the like; audio product parts such as compact disk, laser disk, speaker and the like; communication instrument parts such as light cable ferrule, telephone parts, facsimile parts, modem and the like; copy machine-related parts such as separation claw, heater holder and the like; machine parts such as impeller, fan, toothed wheel, gear, bearing, motor parts and motor case, and the like; automobile parts such as mechanical parts for automobile, engine parts, inner parts of engine room, electrical equipment, interior parts and the like; cooking appliances such as microwave cooking pan, heat-resistant dish and the like; building raw materials of materials for construction and building such as heat-insulation and sound-insulation materials like flooring material, wall material and the like, supporting materials like beam, pillar and the like, roof materials and the like; airplane parts, space ship parts, materials of radiation facility such as nuclear reactor and the like, materials of marine facility, washing jig, parts of optical instrument, valves, pipes, nozzles, filters, membrane, medical instruments parts and medical materials, parts of sensors, sanitary equipment, sport goods, leisure goods, and the like.

EXAMPLES

Examples of the present invention include, but are not limited to, the following embodiments. In the examples, evaluation of performances of an injection molded articles was conducted according to the following methods.
(1) Flexural modulus:
A specimen of length 127 mm×width 12.7 mm×thickness 6.4 mm was used, and flexural modulus was measured according to ASTM D790.
(2) Tensile strength:
ASTM No. 4 dumbbell was used, and tensile strength was measured according to ASTM D638.
(3) Izod impact strength (no notch):
A flexural test specimen of length 127 mm×width 12.7 mm×thickness 6.4 mm was bisected along the injection direction and used as a specimen, and Izod impact strength was measured according to ASTM D256.
(4) Deflection temperature under load:
A specimen of 12.7 mm×6.4 mm×127 mm was used, and deflection temperature under load was measured according to ASTM D648 at a load of 18.6 kg/cm².
(5) Solder heat-resistance:
A JIS K7113 No. (½) dumbbell specimen (thickness: 1.2 mm) was used, the test specimen was immersed in a solder bath heated to given temperature for 60 seconds, and presence or absence of blister and deformation on the specimen after removal was observed visually. The test was conducted while increasing the temperature of the solder bath gradually by 5° C.

Example 1

100 parts by weight of a liquid crystal polyester resin which is composed of repeating structure units $A_1$, $B_1$, $B_2$ and $C_1$, and in which $A_1$:$B_1$:$B_2$:$C_1$ molar ratio is 60:15:5:20; and 66.7 parts by weight of glass short fiber (CS03JAPX-1, manufactured by Asahi Fiber Glass Corp., surface-treated with urethane resin, number average fiber length: 3 mm, fiber diameter: 10 μm, ignition loss: 0.20% by weight) were mixed in a tumbler, then, the mixture was granulated by a twin-screw extruder (PCM-30 type, manufactured by Ikegai Iron Works, Ltd.) at a cylinder temperature of 340° C., to obtain a pellet composed of a liquid crystal polyester resin composition. The pellet after the granulation was calcinated, and the optical microscope image of the remaining glass fiber was photographed before image analysis, to find that the number-average fiber diameter was 10 μm and the number-average fiber length was 250 μm. The resulted pellet was injection-molded by PS40E5ASE type injection molding machine (manufactured by Nissei Plastic Industrial Co., Ltd.) at a cylinder temperature of 350° C. and a mold temperature of 130° C., to mold a specimen for evaluation. The results are shown in Table 1.

Example 2

The same procedure as in Example 1 was conducted except that glass fiber(RES03TP78, manufactured by Nippon Sheet Glass Co.,Ltd., surface-treated with urethane resin, number average fiber length: 3 mm, number average fiber diameter: 10 μm, ignition loss: 0.25% by weight) was used instead of the surface-treated glass fiber in Example 1. The evaluation results are shown in Table 1.

Example 3

The same procedure as in Example 1 was conducted except that glass fiber(CS03-256S, manufactured by Nitto Boseki Co., Ltd., surface-treated with epoxyurethane resin, number average fiber length: 3 mm, number average fiber diameter: 10 μm, ignition loss: 0.20% by weight) was used instead of the surface-treated glass fiber in Example 1. The evaluation results are shown in Table 1.

Comparative Example 1

Glass fiber (CS03JAPX-1, manufactured by Asahi Fiber Glass Corp., surface-treated with urethane resin, number average fiber length: 3 mm, number average fiber diameter: 10 μm) was treated under 600° C. for 2 hours to remove the urethane resin on the glass fiber. By using the glass fiber instead of the surface-treated glass fiber in Example 1, production of a resin composition pellet was tried in the same manner as in Example 1. However, handling property of the glass fiber was poor, and the glass fiber could not be fed to a granulation apparatus continuously and quantitatively.

Comparative Example 2

The same procedure as in Example 1 was conducted except that glass fiber(CS03-494, manufactured by Asahi Fiber Glass Corp., surface-treated with urethane resin, number average fiber length: 3 mm, number average fiber diameter: 10 μm, ignition loss: 0.5% by weight ) was used instead of the surface-treated glass fiber in Example 1. The evaluation results are shown in Table 1.

Comparative Example 3

The same procedure as in Example 1 was conducted except that glass fiber(EX-9, manufactured by Nippon Sheet Glass Co.,Ltd., surface-treated with epoxy resin, number average fiber length: 3 mm, number average fiber diameter: 10 μm, ignition loss: 0.9% by weight) was used instead of the surface-treated glass fiber in Example 1. The evaluation results are shown in Table 1.

Comparative Example 4

The same procedure as in Example 1 was conducted except that glass fiber(EX-12, manufactured by Nippon Sheet Glass Co.,Ltd., surface-treated with epoxy resin, number average fiber length: 3mm, fiber diameter: 10 μm, ignition loss: 1.2% by weight) was used instead of the surface-treated glass fiber in Example 1. The evaluation results are shown in Table 1.

TABLE 1

|  | Glass fiber which has been surface-treated with thermosetting resin | | Results of ability evaluation | | | | |
| --- | --- | --- | --- | --- | --- | --- | --- |
|  | Kind of thermosetting resin | Ignition loss (% by weight) | Flexural modulus (kg/cm$^2$) | Tensile strength (kg/cm$^2$) | Izod impact strength (kgcm/cm) | Deflection temperature under load (° C.) | Solder heat-resistance |
| Example 1 | Urethane | 0.20 | 116,000 | 1,730 | 35 | 287 | No problem at 300° C. |
| Example 2 | Urethane | 0.25 | 115,000 | 1,700 | 34 | 286 | No problem at 300° C. |
| Example 3 | Epoxy-urethane | 0.20 | 116,000 | 1,690 | 32 | 284 | No problem at 310° C. |
| Comparative example 2 | Urethane | 0.5 | 116,000 | 1,660 | 35 | 276 | Blister generation at 260° C. |
| Comparative example 3 | Epoxy | 0.9 | 113,000 | 1,660 | 32 | 276 | Blister generation at 250° C. |
| Comparative example 4 | Epoxy | 1.2 | 118,000 | 1,630 | 36 | 279 | Blister generation at 230° C. |

The molded article obtained by using the composition of the present invention has excellent mechanical property and heat-resistance, particularly, solder heat-resistance, and the liquid crystal polyester resin composition is extremely useful as material for which heat-resistance is required such as electric and electronic parts.

What is claimed is:

1. A liquid crystal polyester resin composition comprising a liquid crystal polyester resin and surface-treated glass fiber with a thermosetting resin, wherein the ignition loss of the surface-treated glass fiber is from 0.05 to 0.4% by weight.

2. A liquid crystal polyester resin composition according to claim 1, wherein said composition is prepared by compounding glass fiber which has been surface-treated with a thermosetting resin and whose ignition loss is from 0.05 to 0.4% by weight into a liquid crystal polyester resin.

3. A liquid crystal polyester resin composition according to claim 1 or 2, wherein the amount of the surface-treated glass fiber is from 10 to 200 parts by weight based on 100 parts by weight of the liquid crystal polyester resin.

4. A liquid crystal polyester resin composition according to claim 1 or 2, wherein the thermosetting resin is at least one resin selected from epoxy resins, urethane resins and epoxyurethane resins.

5. The liquid crystal polyester resin composition according to claim 1 or 2, wherein the liquid crystal polyester resin contains a repeating structure unit represented by the formula $A_1$ in an amount of 30 mol % or more

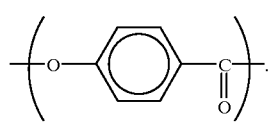

(A$_1$)

6. A molded article obtained by using the liquid crystal polyester resin composition of claim 1 or 2.

\* \* \* \* \*